United States Patent [19]

Sahasrabudhe et al.

[11] 4,247,790
[45] Jan. 27, 1981

[54] FAILSAFE TRAIN VEHICLE CONTROL SIGNAL THRESHOLD DETECTOR APPARATUS

[75] Inventors: Arun P. Sahasrabudhe, Monroeville; Thomas C. Matty, North Huntingdon Township, Irwin County, both of Pa.

[73] Assignee: Westinghouse Electric Corp., Pittsburgh, Pa.

[21] Appl. No.: 651,304

[22] Filed: Jan. 22, 1976

[51] Int. Cl.³ .................... H03K 5/153; B61L 21/06
[52] U.S. Cl. .......................... 307/350; 246/28 F;
250/551; 307/311; 307/363
[58] Field of Search ............... 307/311, 350, 363;
328/2, 5; 250/222, 221, 223, 551; 246/34 R, 28
F, 34 CT, 62, 63 R, 63 A, 63 C; 340/146.3 K,
228 S, 258 B, 38 P

[56] References Cited

U.S. PATENT DOCUMENTS

| | | | |
|---|---|---|---|
| 3,816,745 | 6/1974 | Primm et al. | 340/258 B |
| 3,826,930 | 7/1974 | Perry | 307/311 |
| 3,925,709 | 12/1975 | Mitchell et al. | 307/311 |
| 3,964,041 | 6/1976 | Hinds | 340/258 B |
| 3,995,173 | 11/1976 | Sibley | 307/311 |
| 3,999,133 | 12/1976 | Lee et al. | 307/311 |

Primary Examiner—John Zazworsky
Attorney, Agent, or Firm—R. G. Brodahl

[57] ABSTRACT

A more failsafe signal voltage threshold determining apparatus is disclosed for operation in a train vehicle control system, and which utilizes the forward voltage drop characteristic of an input light emitting diode of an optical isolator device as a train vehicle control signal threshold reference. The detector transistor of the optical isolator device provides an output control signal in response to an input train vehicle control signal applied to the light emitting diode which has a voltage level high enough to overcome the light emitting diode voltage drop.

4 Claims, 4 Drawing Figures

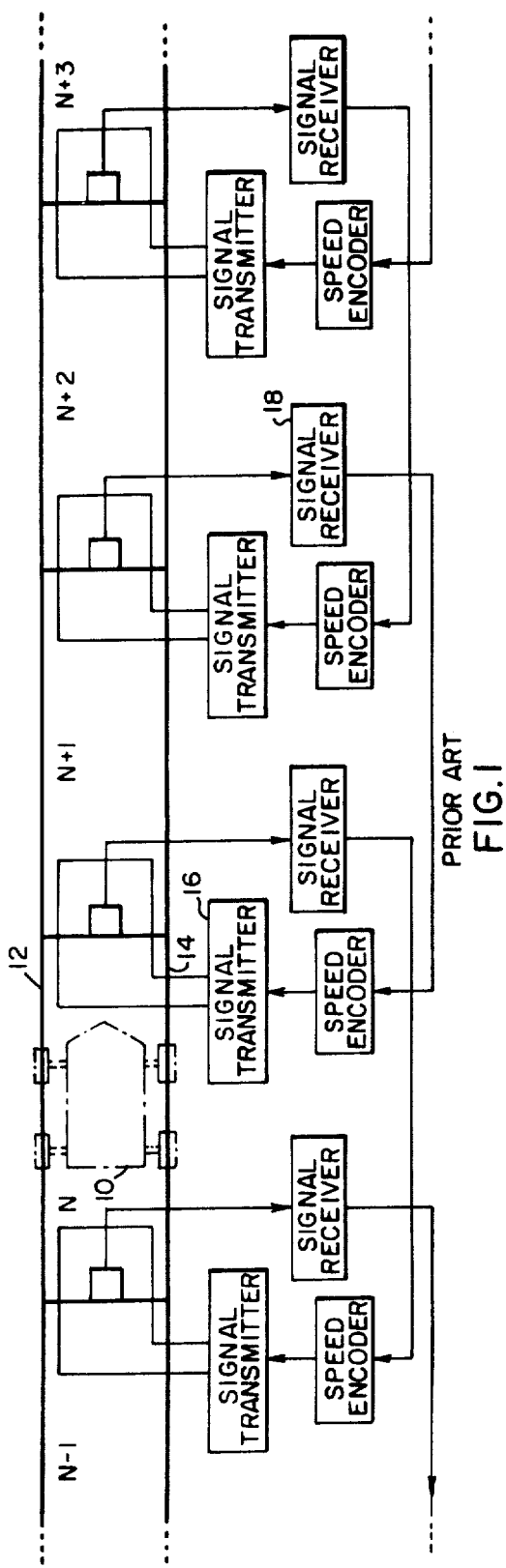
FIG. 1 PRIOR ART
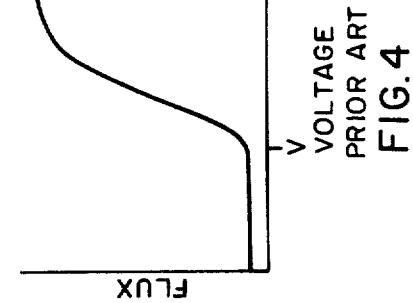
FIG. 4 PRIOR ART
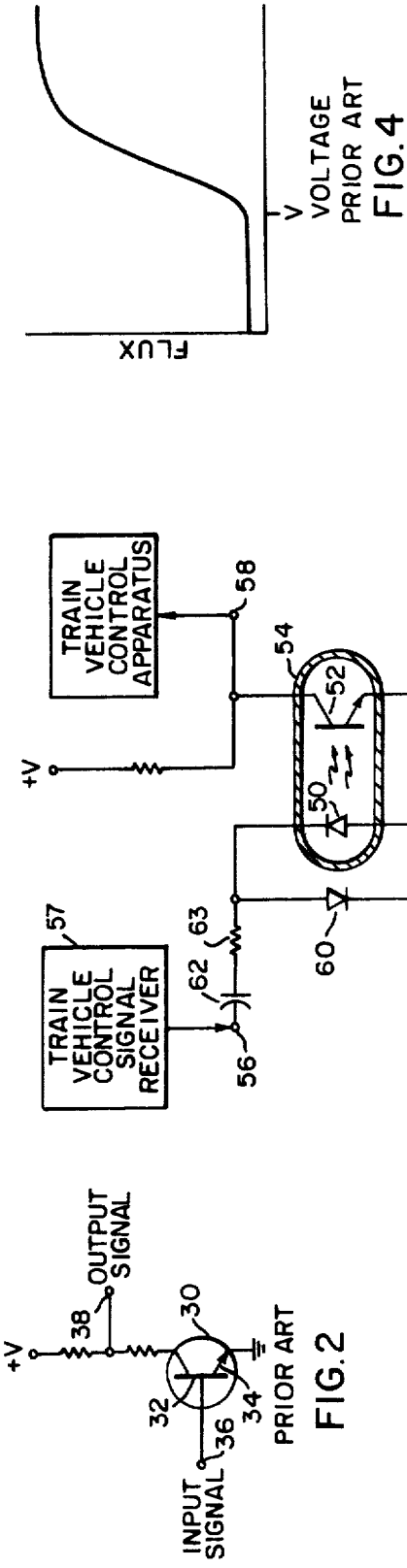
FIG. 3
FIG. 2 PRIOR ART

FAILSAFE TRAIN VEHICLE CONTROL SIGNAL THRESHOLD DETECTOR APPARATUS

CROSS-REFERENCE TO RELATED APPLICATION

The present invention is related to the invention covered by a copending patent application entitled "Signal Threshold Responsive Apparatus", Ser. No. 568,225, filed Apr. 15, 1975 and assigned to the same assignee.

BACKGROUND OF THE INVENTION

It is known in the prior art to employ a train vehicle control signal voltage threshold determining device to establish the presence of a train vehicle within a defined signal block of a track system, such as disclosed in U.S. Pat. No. 3,657,663 of R. S. Rhoton et al. A transistor threshold circuit is employed in relation to the forward conduction voltage of its base emitter junction for the desired signal voltage threshold determination function. A speed coded audio frequency carrier train vehicle control signal is supplied to a particular signal block for controlling the operating speed of a train vehicle present within that signal block, and in addition an occupancy detection receiver is operative with the signal block to determine when that signal block is occupied by a train vehicle in relation to the absence of the supplied speed coded signal at the input of that receiver.

It is known in the prior art to employ an optically coupled logic network such as disclosed in U.S. Pat. No. 3,826,930 of R. H. Perry. A light emitting diode is operative with a light responsive device such as a photo diode for controlling the logic operation of that network.

It is known in the prior art to employ a Zener impedance breakdown diode to sense the voltage level of an applied signal to determine the threshold level of that applied signal as disclosed in U.S. Pat. No. 3,760,192 of J. O. G. Darrow. The Zener diode level detector can be used to provide the operating potential to an oscillator whenever the applied input signal level is adequate to break down the impedance of the Zener diode.

It is desired that a failsafe train vehicle control signal voltage threshold determination function be provided wherein leakage current is no problem such as a collector to base leakage current in conjunction with the impedance of a base lead or a collector lead to develop an undesired voltage across the latter impedance for forward biasing the device and making it unreliable for voltage threshold reference purposes.

SUMMARY OF THE INVENTION

A failsafe train vehicle control signal threshold detector apparatus is provided utilizing the forward voltage drop of a light emitting diode operative with a photo responsive transistor as an optical isolator device. The phototransistor provides an output signal when the input signal voltage applied to the light emitting diode is adequate to overcome the light emitting diode voltage drop. Since output signal provision depends upon the optical energy output of the light emitting diode, the present apparatus provides a failsafe check on the integrity of the apparatus. In addition, alternating input signal coupling prevents reduction of the desired input train vehicle control signal voltage threshold level due to direct current drift.

BRIEF DESCRIPTION OF THE DRAWINGS

FIG. 1 is a schematic illustration of a prior art train vehicle speed control and signal block occupancy detection system;

FIG. 2 is a diagrammatic showing of a prior art signal voltage threshold detector circuit;

FIG. 3 is a diagrammatic illustration of the present invention; and

FIG. 4 shows a curve to illustrate the well-known photon energy output characteristic of a light emitting diode in relation to signal voltage applied across that diode.

DESCRIPTION OF THE PREFERRED EMBODIMENT

In FIG. 1 there is shown a prior art train vehicle speed control and signal block occupancy detection system such as disclosed in U.S. Pat. No. Reissue 27,472 of G. M. Thorne-Booth. The vehicle 10 moves along track rails 12 and 14 operative as a plurality of signal blocks N, N+1, N+2, N+3, etc. A speed coded signal transmitter and receiver are provided for each signal block, for example the signal transmitter 16 and signal receiver 18 are operative to control the speed of a train vehicle within the signal block N+1 and to detect the occupancy by a train vehicle of the signal block N+1.

In FIG. 2 there is shown a prior art transistor threshold circuit including a transistor 30 and employing the forward conduction voltage of the junction between the base 32 and the emitter 34 for the desired signal voltage reference threshold action. The input signal applied to input terminal 36 must have at least a known voltage level before the base emitter junction of the transistor 30 will break down and provide an output signal at terminal 38. It is well known to utilize a common base circuit arrangement to provide this same function.

In FIG. 3 there is shown the train vehicle control signal voltage threshold detector apparatus of the present invention including a light emitting diode 50 optically coupled with an output detector transistor 52. The forward voltage drop of the diode 50 is operative to provide the desired signal voltage threshold reference since a predetermined minimum input signal is required across the diode 50 before photon light is supplied in relation to exceeding the known work function of the diode 50. By physically shielding and protecting the combination of the diode 50 and transistor 52 by a suitable shield 54, no undesired leakage of light will interfere with the voltage threshold reference function of the apparatus. The alternating current input train vehicle control signal voltage applied to input terminal 56 by the train vehicle control signal receiver 57 must exceed the work function of the diode 50 before the diode 50 will emit photons which are proportional to the amplitude of the input signal current through the diode 50. The receptor transistor 52 will provide an output signal at terminal 58 to the train vehicle control apparatus 59 that is proportional to the current amplitude of the input signal applied to terminal 56. The photon flux emitted by diode 50 is more or less proportional to the signal current flow through the diode 50 determined by applied input voltage. This is shown by the curve of FIG. 4 above the indicated practical operating voltage V of interest for the purpose of controlling train vehicles.

Since the work function of the diode 50 is being used here as an input signal voltage threshold reference, the input signal voltage has to be at least of the predetermined minimum value at which current flows through the diode 50. Once the current begins to flow through the diode 50, the resulting light photons will energize the transistor 52.

The light energy coupling between the diode 50 and the transistor 52 within the protective shield 54 operates as an intermediate energy transfer medium to protect against sneak signal paths and the like to make the present apparatus operative in a more failsafe manner in relation to train vehicle control requirements. The frequency of the input signal applied to input terminal 56, as shown in FIG. 3, is of importance for train speed control requirements which input signal frequency must pass through the photon coupling within the shield 54 and be greater in voltage level than the breakdown threshold of the diode 50. This alternating signal coupling prevents undesired reduction of the desired threshold reference by direct current signal drift. Since the output detector transistor 52 operates on the optical energy output of the light emitting diode 50, the present apparatus provides a check on the integrity of the threshold apparatus. Thus, if the light emitting diode 50 shorts, opens or develops leakage across itself, the circuit either gives no output signal at terminal 58 or a reduced output signal thus raising the effective threshold.

The presence of the signal at terminal 58 from the output transistor 52 indicates that the signal applied across the diode 50 is above the threshold reference of that diode 50. Current transfer ratio of the optical isolator apparatus has a secondary effect on the threshold and the present design can be based on the maximum ratio for which the device can be screened. Isolation provided by the optical isolator apparatus minimizes leakage problems although direct current power is applied directly to the output detector transistor 52. Referencing the anode of the light emitting diode 50 and the transistor emitter to the same reference voltage eliminates any possibility of reduction in threshold due to this leakage. Another diode 60 connected across the input of the light emitting diode 50, protects against excessive reverse voltage. The series resistor 63 enables scaling and calibration of the threshold voltage of the light emitting diode 50. The circuit is capacitively coupled at the input through the capacitor 62. The optical isolator can be referenced to the most negative system voltage so that if the capacitor 62 shorts the direct current offset due to the reference voltage causes a substantial increase in the threshold reference.

If desired the present apparatus can be used on board the vehicle for speed signal decoding and threshold determination purposes.

What is claimed is:

1. In train vehicle control signal threshold detector apparatus operative with a source of an offset voltage, the combination of:
   means for providing a train vehicle alternating current input control signal;
   means responsive to said alternating current input control signal for providing a photon energy output when the voltage of said input signal is above a predetermined threshold voltage reference, and
   means responsive to said photon energy output for providing an output signal proportional to said photon energy output, with each of said photon energy output providing means and said output signal providing means being coupled to said offset voltage source for preventing direct current reduction of said predetermined threshold voltage reference.

2. The train vehicle control signal threshold detector apparatus of claim 1,
   with said photon energy output being proportional to the amplitude of the input signal current flow through said photon energy output providing means and with said offset voltage source providing a negative offset voltage.

3. The train vehicle control signal threshold detector apparatus of claim 1,
   with said photon energy output providing means having a predetermined work function which must be exceeded by the input signal voltage before said photon energy output is provided.

4. The train vehicle control signal threshold detector apparatus of claim 1,
   with said photon energy output providing means having a forward voltage drop characteristic operative as said predetermined threshold voltage reference.

* * * * *